United States Patent
Zhai et al.

(10) Patent No.: US 9,417,305 B2
(45) Date of Patent: Aug. 16, 2016

(54) METHOD AND APPARATUS FOR RECONSTRUCTION OF MAGNETIC RESONANCE IMAGING

(71) Applicant: Shanghai United Imaging Healthcare Co., Ltd., Shanghai (CN)

(72) Inventors: Renkuan Zhai, Shanghai (CN); Qiang Zhang, Shanghai (CN); Weiguo Zhang, Shanghai (CN)

(73) Assignee: SHANGHAI UNITED IMAGING HEALTHCARE CO., LTD. (CN)

( * ) Notice: Subject to any disclaimer, the term of this patent is extended or adjusted under 35 U.S.C. 154(b) by 8 days.

(21) Appl. No.: 14/585,957

(22) Filed: Dec. 30, 2014

(65) Prior Publication Data

US 2015/0187072 A1    Jul. 2, 2015

(30) Foreign Application Priority Data

Dec. 31, 2013    (CN) .......................... 2013 1 0754019

(51) Int. Cl.
*G06K 9/00* (2006.01)
*G01R 33/56* (2006.01)
*G01R 33/561* (2006.01)

(52) U.S. Cl.
CPC ........ *G01R 33/5608* (2013.01); *G01R 33/5611* (2013.01)

(58) Field of Classification Search
None
See application file for complete search history.

(56) References Cited

U.S. PATENT DOCUMENTS

| | | | | |
|---|---|---|---|---|
| 7,859,262 | B2 * | 12/2010 | Jellus | G01R 33/5611 324/307 |
| 2005/0200357 | A1 * | 9/2005 | Pruessmann | G01R 33/5611 324/309 |
| 2008/0285833 | A1 * | 11/2008 | Fu | G01R 33/5611 382/131 |
| 2010/0244825 | A1 * | 9/2010 | Brau | G01R 33/5611 324/309 |
| 2015/0108977 | A1 * | 4/2015 | Kim | G01R 33/5611 324/309 |

OTHER PUBLICATIONS

Yeh, et al., "3Parallel Magnetic Resonance Imaging with Adaptive Radius in k-Space (PARS): Constrained Image Reconstruction using k-Space Locality in Radiofrequency Coil Encoded Data," Magnetic Resonance in Medicine 53:1383-1392 (2005).*

* cited by examiner

*Primary Examiner* — Shefali Goradia
(74) *Attorney, Agent, or Firm* — St Onge Steward Johston and Reens LLC

(57) ABSTRACT

A method and an apparatus for reconstruction of magnetic resonance imaging are provided. The method includes collecting data in each initial channel and filling the data in an initial K-space, the data including data in a calibration data area and data in an undersampled area; constructing a target virtual space, and mapping initial K-space data to the target virtual space; constructing, in the target virtual space, a target optimized virtual space by retaining channel data having a high signal-to-noise ratio; filling out the undersampled area in the target optimized virtual space, and acquiring complete data in the target optimized virtual space; converting the complete data in the target optimized virtual space to an image domain to obtain an image. The method advantageously increases the signal-to-noise ratio of the channel data and significantly improves the image quality.

14 Claims, 4 Drawing Sheets

METHOD AND APPARATUS FOR RECONSTRUCTION OF MAGNETIC RESONANCE IMAGING

FIELD OF THE INVENTION

The present invention relates to magnetic resonance imaging (MRI), and more specifically, to a method and apparatus for reconstructing magnetic resonance image.

BACKGROUND OF THE INVENTION

In magnetic resonance imaging, imaging speed is an important criterion in evaluating imaging method. Factors affecting the imaging speed include data collecting time and/or K-space fill-in time. A conventional data sampling method requires a full-size sampling of the K-space data before MRI reconstruction can be performed. MRI reconstruction with parallel sampling technique utilizes a coil array combination method to fill the un-sampled data and perform reconstruction with the completely filled K-space data. With such method, only a portion of the K-space data, rather than the whole K-space data, is required for sampling. As such, the data sampling time is decreased and the imaging speed is increased.

One of the commonly adopted parallel reconstruction methods is GRAPPA. FIG. 1 illustrates a conventional GRAPPA algorithm, where black solid dots denote the actually sampled K-space data, white hollow dots denote un-sampled data which needs to be filled in by parallel reconstruction method, and grey solid dots denote data which is sampled for the purpose of calculating parameters for coil array combination. According to GRAPPA algorithm, any hollow dot in the figure can be represented by linear addition of the adjacent black solid dots. This equals to the combination of data from a plurality of coils. The combination coefficient $n_{ij}$ (coil i, position j, as shown in FIG. 1) can be determined from the black solid dots for best fitting the grey dots. After the coefficient is determined, the data represented by the other white hollow dots now can be renewed from data collected by coils multiplying combination coefficient. In certain situation, in the data acquired via the foregoing parallel sampling technique, there is a large portion of noise component. The quality of the image obtained from such data can be compromised by the noise.

SUMMARY OF THE INVENTION

In order to solve the problem with the prior art for cases when the magnetic resonance imaging data has large amount of noises, a method for reconstruction of magnetic resonance imaging is provided according to the present invention.

The method for reconstruction of magnetic resonance imaging includes the following steps:

collecting data in each initial channel and filling said data in an initial K-space, said data including data in a calibration data area and data in an undersampled area;

constructing a target virtual space Sp, and mapping initial K-space data to said target virtual space Sp;

constructing, in said target virtual space Sp, a target optimized virtual space Sp1 by retaining channel data having a high signal-to-noise ratio;

filling out said undersampled area in said target optimized virtual space Sp1, and acquiring complete data in said target optimized virtual space Sp1;

converting said complete data in the target optimized virtual space Sp1 to an image domain to obtain an image.

Preferably, the step of mapping initial K-space data to said target virtual space Sp further comprises:

selecting partial data in each initial channel and calculating a mapping from said initial K-space to said target virtual space Sp based on said partial data;

mapping initial K-space data to said target virtual space Sp based on said mapping.

Preferably, treating an RO direction vector of said partial data in each initial channel as an object to be extracted, calculating a covariance matrix M1 of said extracted object;

calculating orthogonal eigenvectors of the normalized covariance matrix M1, forming a matrix OP1 with all the orthogonal eigenvectors, wherein said matrix OP1 indicates said mapping from said initial K-space to said target virtual space Sp;

multiplying said initial K-space data and said matrix OP1 to obtain data mapped to said target virtual space Sp.

Preferably, the step of constructing a target optimized virtual space Sp1 by retaining channel data having a high signal-to-noise ratio comprises:

multiplying a modulation function f(ch) along a channel direction, that is, Sp1 (ro, pe, ch)=Sp(ro, pe, ch)×f(ch).

Preferably, the modulation function is expressed as $$f(ch) = \begin{cases} 1 & ch \leq CH \\ 0 & \text{other} \end{cases},$$

where CH denotes the number of retained channels.

Preferably, the number of retained channels can be expressed as CH=n×80%, where parameter n denotes the number of channels.

Preferably, $$f(ch) = \exp\left(\frac{1-ch}{CH}\right),$$

where CH denotes an attenuation coefficient.

Preferably, the attenuation coefficient CH equals to n, where n denotes the number of channels.

Preferably, the step of filling out undersampled area in said target optimized virtual space Sp1, and acquiring complete data in said target optimized virtual space Sp1 comprises:

performing a convolution of data A in said calibration data area and target data B of said calibration data to obtain a combination coefficient N; filling unsampled data in said undersampled area based on said combination coefficient N and the sampled data.

An apparatus for reconstruction of magnetic resonance imaging is also provided according to the present invention. The apparatus includes the following units:

a collection unit, configured to collect data in each initial channel and fill said data in an initial K-space, said data including data in a calibration data area and data in an undersampled area;

a first mapping unit, configured to construct a target virtual space Sp and map initial K-space data to said target virtual space Sp;

a second mapping unit, configured to construct, in said target virtual space Sp, a target optimized virtual space Sp1 by retaining channel data having a high signal-to-noise ratio;

a data filling unit, configured to fill out said undersampled area in said target optimized virtual space Sp1, and acquire complete data in said target optimized virtual space Sp1;

a data conversion unit, configured to convert said complete data in said target optimized virtual space Sp1 to an image domain to obtain an image.

Preferably, said first mapping unit is further configured to select partial data in each initial channel and calculate a mapping from the initial K-space to the target virtual space Sp based on the partial data, and map the initial K-space data to the target virtual space Sp based on said mapping.

Preferably, said first mapping unit is further configured to use an RO direction vector of the partial data in each initial channel as the object to be extracted; calculate the covariance matrix M1 of the extracted object; calculate the orthogonal eigenvector of the normalized covariance matrix M1; form a matrix OP1 with all the orthogonal eigenvector, wherein said OP1 indicates the mapping from the initial K-space to the target virtual space Sp; and multiply the initial K-space data and the matrix OP1 to obtain the data mapped to the target virtual space Sp.

Preferably, said second mapping unit is configured to multiply a modulation function f(ch) along a channel direction, that is, Sp1(ro, pe, ch)=Sp(ro, pe, ch)×f(ch).

Preferably, said data filling unit is configured to perform a convolution of data A in said calibration data area and target data B of said calibration data to obtain a combination coefficient N, and fill unsampled data in said undersampled area based on said combination coefficient N and the sampled data.

The method for reconstruction of magnetic resonance imaging provided according to the present invention advantageously increases the signal-to-noise ratio of the channel data and significantly improves the image quality by constructing the image which is obtained by mapping the initially collected and unfilled K-space to a virtual space, removing the noise in the virtual space, retaining the channel data having a relatively high signal-to-noise ratio and performing parallel reconstruction. An apparatus for reconstruction of magnetic resonance imaging is also provided according to the present invention.

DETAILED DESCRIPTION OF THE INVENTION

More details are illustrated in the below description for a better understanding of the present invention. However, the present invention can be implemented with other methods different from what is described herein. A skilled person in the art may make analogy without departing from the spirit of the present invention. Thus, the present invention is not limited by the following disclosed embodiments. Second, drawings are used by the present invention for detailed description. When detailed embodiments are described, drawings are used as examples for illustration, rather than limiting with respect to the scope of the present invention.

A method for reconstruction of magnetic resonance imaging includes the following steps.

Step S10): collecting data in each initial channel and filling said data in an initial K-space, said data including data in a calibration data area and data in an undersampled area.

Step S20): constructing a target virtual space Sp, and mapping the initial K-space data to the target virtual space Sp.

Step S30): constructing, in the target virtual space Sp, a target optimized virtual space Sp1 by retaining channel data having a high signal-to-noise ratio.

Step S40): filling out an undersampled area in the target optimized virtual space Sp1, and acquiring complete data in the target optimized virtual space Sp1.

Step S50): converting the complete data in the target optimized virtual space Sp1 to an image domain to obtain image.

Figure 1:
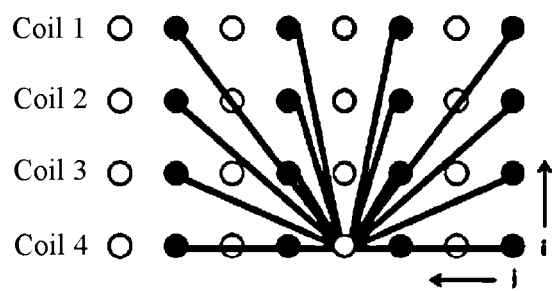
FIG. 1 is an illustration of prior art parallel data collecting and filling.
Figure 2:
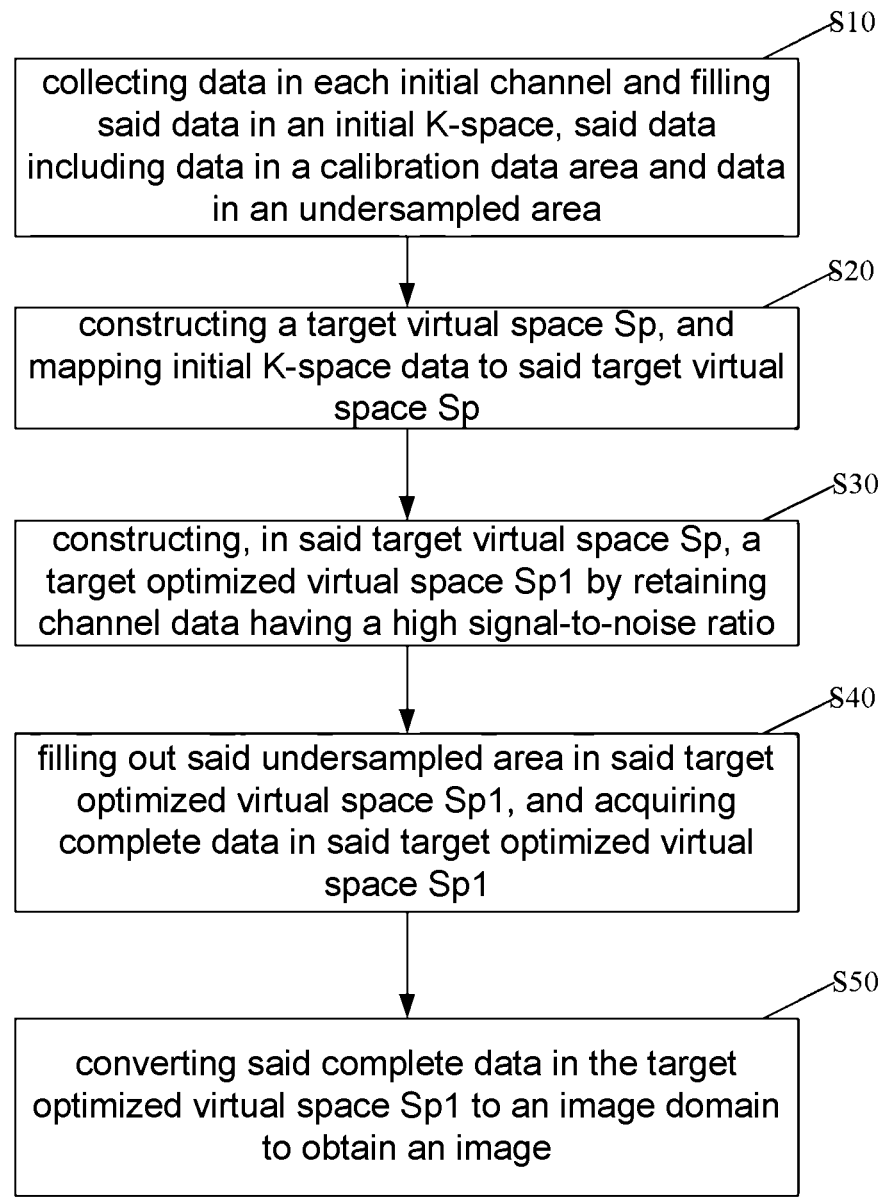
FIG. 2 is flowchart of a method for reconstruction of magnetic resonance imaging according to the present invention.

A method for reconstruction of magnetic resonance imaging is described below in connection with the drawings. As shown in FIG. 2, Step S10) is performed by collecting data in each initial channel and filling said data in an initial K-space, said data including data in a calibration data area (full sampled area) and data in an undersampled area.

The data in each channel includes the data in the full sampled area for calibration data as well as the data in the undersampled area. When these data is filled in the initial K-space, the initial K-space is actually an undersampled K-space.

Step S20) is performed by constructing a target virtual space Sp, and mapping the initial K-space data to the target virtual space Sp.

Partial data in each initial channel is selected and a mapping from the initial K-space to the target virtual space Sp is calculated based on the partial data. The initial K-space data is mapped to the target virtual space Sp based on said mapping.

Specifically, RO direction vector of the partial data in each initial channel is used as the object to be extracted. The covariance matrix M1 of the extracted object is calculated. The orthogonal eigenvectors of the normalized covariance matrix M1 are calculated. All the orthogonal eigenvectors forms a matrix OP1, which indicates the mapping from the initial K-space to the target virtual space Sp. The data mapped to the target virtual space Sp is obtained by multiplying the initial K-space data with the matrix OP1.

Step 30) is performed by constructing, in the target virtual space Sp, a target optimized virtual space Sp1 by retaining channel data having a high signal-to-noise ratio.

The step of constructing a target optimized virtual space Sp1 by retaining channel data having a high signal-to-noise ratio specifically comprises multiplying a modulation function f(ch) along a channel direction, i.e., Sp1(ro, pe, ch)=Sp(ro, pe, ch)×f(ch).

The modulation function is expressed as $$f(ch) = \begin{cases} 1 & ch \leq CH \\ 0 & other \end{cases},$$

where CH denotes the number of retained channels. Preferably, the number of retained channels can be expressed as CH=n×80%, where parameter n denotes the number of channels.

In another embodiment, the modulation function is expressed as $$f(ch) = \exp\left(\frac{1-ch}{CH}\right),$$

where CH denotes an attenuation coefficient. Preferably, the attenuation coefficient CH equals to the number of channels.

Step 40) is performed by filling out the undersampled area in the target optimized virtual space Sp1 and acquiring complete data in the target optimized virtual space Sp1.

Specifically, convolution of the data A in the calibration data area and the target data B of the calibration data is performed and the combination coefficient N is obtained. Unsampled data in the undersampled area is filled based on the combination coefficient N and the sampled data.

Step 50) is performed by converting the complete data in the target optimized virtual space Sp1 to an image domain to obtain image.

A conventional approach can be utilized to convert the complete data in the target virtual space Sp1 into the image domain. One-dimensional Fourier transform can be performed in read-out (RO) direction and phase encoding (PE) direction, respectively, to obtain the image.

Figure 3:
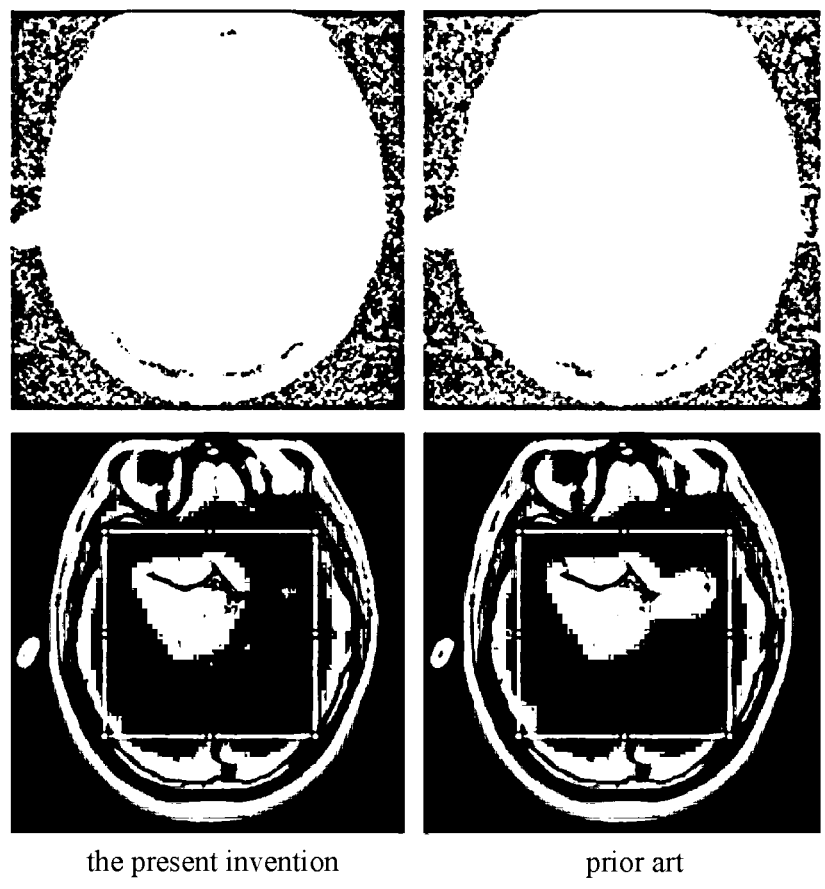
FIG. 3 is a comparison chart showing the comparison effect between data processed by the technical scheme according to the present invention and the data processed by the conventional method.

As illustrated in FIG. 3, after comparing the image obtained via the present method with the image obtained via the conventional method, the upper chart is the comparison chart for background noise portion. The lower chart is the comparison chart for signal area. After being processed by the present method, there is a remarkable drop at the background noise portion, while there is no significant change in the signal portion. The comparison is made based on the same window width and window level. According to the present method, the background noise level within the box is 207, while the background noise level is 283 according to the conventional method. The signal level within the box is 4554, while the signal level is 4565 according to the conventional method. The signal-to-noise ratio according to the present method is 22.0, while the signal-to-noise ratio according to the conventional method is 16.1. As can be seen, the signal-to-noise ratio of the data obtained by the present method is greatly improved.

Figure 4:
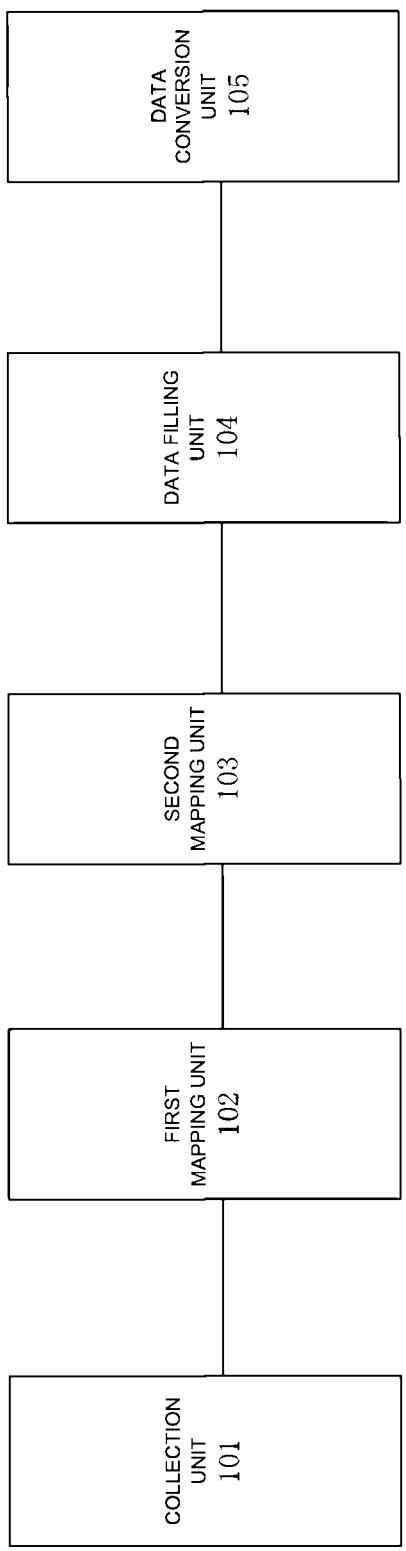
FIG. 4 is a schematic illustrating the structure of an apparatus for reconstruction of magnetic resonance imaging according to the present invention.

As shown in FIG. 4, an apparatus for reconstruction of magnetic resonance imaging is further provided according to the present invention. The apparatus includes the following units.

A collection unit 101 is configured to collect data in each initial channel and fill said data in an initial K-space, said data including data in a calibration data area and data in an undersampled area.

A first mapping unit 102 is configured to construct a target virtual space Sp and map the initial K-space data to the target virtual space Sp.

In one embodiment, the first mapping unit 101 can be further configured to select partial data in each initial channel and calculate a mapping from the initial K-space to the target virtual space Sp based on the partial data, and map the initial K-space data to the target virtual space Sp based on said mapping.

Further, the first mapping unit 101 is further configured to use RO direction vector of the partial data in each initial channel as the object to be extracted; calculate the covariance matrix M1 of the extracted object; calculate the orthogonal eigenvectors of the normalized covariance matrix M1; form a matrix OP1 with all the orthogonal eigenvectors, wherein said OP1 indicates the mapping from the initial K-space to the target virtual space Sp; and multiply the initial K-space data and the matrix OP1 to obtain the data mapped to the target virtual space Sp.

The second mapping unit 103 is configured to construct, in the target virtual space Sp, a target optimized virtual space Sp1 by retaining channel data having a high signal-to-noise ratio.

In one embodiment, the second mapping unit is configured to multiply a modulation function f(ch) along a channel direction, i.e., Sp1(ro, pe, ch)=Sp(ro, pe, ch)×f(ch).

The modulation function may be expressed as $$f(ch) = \begin{cases} 1 & ch \leq CH \\ 0 & \text{other} \end{cases},$$

where CH denotes the number of retained channels.

Preferably, the number of retained channels can be expressed as CH=n×80%, where parameter n denotes the number of channels.

In another embodiment, the modulation function may be expressed as $$f(ch) = \exp\left(\frac{1-ch}{CH}\right),$$

where CH denotes an attenuation coefficient. Preferably, the attenuation coefficient CH equals to the number of channels.

A data filling unit 104 is configured to fill out the undersampled area in the target optimized virtual space Sp1 and acquire complete data in the target optimized virtual space Sp1. Specifically, convolution of the data A in the calibration data area and the target data B of the calibration data is performed and the combination coefficient N is obtained. Unsampled data in the undersampled area is filled based on the combination coefficient N and the sampled data.

A data conversion unit 105 is configured to convert the complete data in the target optimized virtual space Sp1 to an image domain to obtain image.

The method for reconstruction of magnetic resonance imaging provided according to the present invention advantageously increases the signal-to-noise ratio of the channel data and significantly improves the image quality by constructing the image which is obtained by mapping the initially collected and unfilled K-space to a virtual space, removing the noise in the virtual space, retaining the channel data having a relatively high signal-to-noise ratio and performing parallel reconstruction. An apparatus for reconstruction of magnetic resonance imaging is also provided according to the present invention.

Although the present invention has disclosed the above content, the present invention is not limited by such disclosure. Any skilled person in the art is able to make various changes and modifications without departing from the spirit of the present invention. Therefore, the scope of the present invention should be determined by the scope of claims.

What is claimed is:

1. A method for reconstruction of magnetic resonance imaging comprising the steps of:
   collecting data in each initial channel and filling said data in an initial K-space, said data including data in a calibration data area and data in an undersampled area;

constructing a target virtual space Sp, and mapping initial K-space data to said target virtual space Sp;

constructing, in said target virtual space Sp, a target optimized virtual space Sp1 by retaining channel data having a high signal-to-noise ratio;

filling out said undersampled area in said target optimized virtual space Sp1 and acquiring complete data in said target optimized virtual space Sp1;

converting said complete data in the target optimized virtual space Sp1 to an image domain to obtain an image.

2. The method for reconstruction of magnetic resonance imaging of claim 1, wherein the step of mapping initial K-space data to said target virtual space Sp comprises:

selecting partial data in each initial channel and calculating a mapping from said initial K-space to said target virtual space Sp based on said partial data;

mapping initial K-space data to said target virtual space Sp based on said mapping.

3. The method for reconstruction of magnetic resonance imaging of claim 2 further comprising the steps of:

treating an RO direction vector of said partial data in each initial channel as an object to be extracted, calculating a covariance matrix M1 of said extracted object;

calculating orthogonal eigenvectors of the normalized covariance matrix M1, forming a matrix OP1 with all the orthogonal eigenvectors, wherein said matrix OP1 indicates said mapping from said initial K-space to said target virtual space Sp;

multiplying said initial K-space data and said matrix OP1 to obtain data mapped to said target virtual space Sp.

4. The method for reconstruction of magnetic resonance imaging of claim 1, wherein the step of constructing a target optimized virtual space Sp1 by retaining channel data having a high signal-to-noise ratio comprises:

multiplying a modulation function f(ch) along a channel direction, wherein Sp1(ro, pe, ch)=Sp(ro, pe, ch)×f(ch).

5. The method for reconstruction of magnetic resonance imaging of claim 4, wherein said modulation function is expressed as $$f(ch) = \begin{cases} 1 & ch \leq CH \\ 0 & other \end{cases},$$

where CH denotes the number of the retained channels.

6. The method for reconstruction of magnetic resonance imaging of claim 5, wherein the number of the retained channels is expressed as CH=n×80%, where n denotes the number of channels.

7. The method for reconstruction of magnetic resonance imaging of claim 4, wherein $$f(ch) = \exp\left(\frac{1-ch}{CH}\right),$$

where CH denotes an attenuation coefficient.

8. The method for reconstruction of magnetic resonance imaging of claim 7, wherein said attenuation coefficient CH equals to n, where n denotes the number of channels.

9. The method for reconstruction of magnetic resonance imaging of claim 1, wherein the step of filling out said undersampled area in said target optimized virtual space Sp1 and acquiring complete data in said target optimized virtual space Sp1 comprises:

performing a convolution of data A in said calibration data area and target data B of said calibration data to obtain a combination coefficient N; filling unsampled data in said undersampled area based on said combination coefficient N and the sampled data.

10. An apparatus for reconstruction of magnetic resonance imaging, comprising:

a collection unit, configured to collect data in each initial channel and fill said data in an initial K-space, said data including data in a calibration data area and data in an undersampled area;

a first mapping unit, configured to construct a target virtual space Sp and map initial K-space data to said target virtual space Sp;

a second mapping unit, configured to construct, in said target virtual space Sp, a target optimized virtual space Sp1 by retaining channel data having a high signal-to-noise ratio;

a data filling unit, configured to fill out said undersampled area in said target optimized virtual space Sp1, and acquire complete data in said target optimized virtual space Sp1;

a data conversion unit, configured to convert said complete data in said target optimized virtual space Sp1 to an image domain to obtain an image.

11. The apparatus for reconstruction of magnetic resonance imaging of claim 10, wherein said first mapping unit is further configured to select partial data in each initial channel and calculate a mapping from said initial K-space to said target virtual space Sp based on the partial data, and map said initial K-space data to said target virtual space Sp based on said mapping.

12. The apparatus for reconstruction of magnetic resonance imaging of claim 10, wherein said first mapping unit is further configured to use RO direction vector of said partial data in each initial channel as an object to be extracted; calculate a covariance matrix M1 of said extracted object; calculate orthogonal eigenvectors of the normalized covariance matrix M1; form a matrix OP1 with all said orthogonal eigenvectors, wherein said OP1 indicates said mapping from said initial K-space to said target virtual space Sp; and multiply said initial K-space data and said matrix OP1 to obtain data mapped to said target virtual space Sp.

13. The apparatus for reconstruction of magnetic resonance imaging of claim 10, wherein said second mapping unit is configured to multiply a modulation function f(ch) along a channel direction, that is, Sp1(ro, pe, ch)=Sp(ro, pe, ch)×f(ch).

14. The apparatus for reconstruction of magnetic resonance imaging of claim 13, wherein said data filling unit is configured to perform a convolution of data A in said calibration data area and target data B of said calibration data to obtain a combination coefficient N, and fill unsampled data in said undersampled area based on said combination coefficient N and the sampled data.

* * * * *